(12) United States Patent
Godo et al.

(10) Patent No.: US 8,441,047 B2
(45) Date of Patent: May 14, 2013

(54) SEMICONDUCTOR DEVICE AND METHOD FOR MANUFACTURING THE SAME

(75) Inventors: Hiromichi Godo, Kanagawa (JP); Takayuki Inoue, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 345 days.

(21) Appl. No.: 12/754,393

(22) Filed: Apr. 5, 2010

(65) Prior Publication Data
US 2010/0258802 A1 Oct. 14, 2010

(30) Foreign Application Priority Data

Apr. 10, 2009 (JP) ................................. 2009-095739

(51) Int. Cl.
*H01L 29/80* (2006.01)
*H01L 31/112* (2006.01)

(52) U.S. Cl.
USPC ............................ 257/274; 438/158; 438/159

(58) Field of Classification Search .................. 257/274; 438/158, 159
See application file for complete search history.

(56) References Cited

U.S. PATENT DOCUMENTS

| | | | |
|---|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |

(Continued)

FOREIGN PATENT DOCUMENTS

| | | |
|---|---|---|
| EP | 1 134 811 A1 | 9/2001 |
| EP | 1 443 130 A1 | 8/2004 |

(Continued)

OTHER PUBLICATIONS

M.W. Prins et al.; "A ferroelectric transparent thin-film transistor"; Appl. Phys. Lett. (Applied Physics Letters); Jun. 17, 1996; pp. 3650-3652; vol. 68, No. 25.

(Continued)

*Primary Examiner* — Daniel Whalen
(74) *Attorney, Agent, or Firm* — Fish & Richardson P.C.

(57) ABSTRACT

An object is to provide an n-channel transistor and a p-channel transistor having a preferred structure using an oxide semiconductor. A first source or drain electrode which is electrically connected to a first oxide semiconductor layer and is formed using a stacked-layer structure including a first conductive layer containing a first material and a second conductive layer containing a second material, and a second source or drain electrode which is electrically connected to a second oxide semiconductor layer and is formed using a stacked-layer structure including a third conductive layer containing the first material and a fourth conductive layer containing the second material are included. The first oxide semiconductor layer is in contact with the first conductive layer of the first source or drain electrode, and the second oxide semiconductor layer is in contact with the third and the fourth conductive layers of the second source or drain electrode.

30 Claims, 11 Drawing Sheets

U.S. PATENT DOCUMENTS

| | | | |
|---|---|---|---|
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0039670 A1 | 2/2005 | Hosono et al. | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1* | 10/2008 | Park et al. ............ 257/43 | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0148825 A1* | 6/2010 | Park et al. ............ 326/121 | |
| 2010/0207119 A1* | 8/2010 | Sakata et al. ............ 257/43 | |

FOREIGN PATENT DOCUMENTS

| | | |
|---|---|---|
| EP | 1 737 044 A1 | 12/2006 |
| EP | 2 226 847 A2 | 9/2010 |
| JP | 60-198861 A | 10/1985 |
| JP | 60198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 08264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | 97/06554 A2 | 2/1997 |
| WO | 2004/114391 A1 | 12/2001 |

OTHER PUBLICATIONS

Noboru Kimizuka et al.; "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System"; Journal of Solid State Chemistry; Apr. 1, 1995; pp. 170-178; vol. 116, No. 1.

Masaki Nakamura et al.; "The Phase Relations in the In2O3-Ga2ZnO4-ZnO System at 1350°C."; Journal of Solid State Chemistry; Aug. 1, 1991; pp. 298-315; vol. 93, No. 2.

Masaki Nakamura et al.; "Syntheses and crystal structures of new homologous compounds, indium iron zinc oxides (InFeO3(ZnO)m) (m natural number) and related compounds"; Kotai Butsuri (Solid State Physics); 1993; pp. 317-327; vol. 28, No. 5 (with full English translation).

Kenji Nomura et al.; "Room-temperature fabrication of transparent flexible thin-film transistors using amorphous oxide semiconductors"; Nature; Nov. 25, 2004; pp. 488-492; vol. 432.

Kenji Nomura et al.; "Thin-Film Transistor Fabricated in Single-Crystalline Transparent Oxide Semiconductor"; Science; May 23, 2003; pp. 1269-1272; vol. 300, No. 5623.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: AL and SN-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZNO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZNO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al. "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases,", Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] at Temperatures Over 1000°C.," Journal of Solid State Chemistry, 1985, vol. 60, pp. 382-384.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using Igzo Oxide TFT," SID Digest '08 : SID 'International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al. "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl, Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZNO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In-Ga-Zn-Oxide TFTS With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZNO TFT," IMID '07 Digest, 2007, pp. 1249-1252.

Sakata, J et al., "Development of 4.0-In. AMOLED Display With Driver Circuit Using Amorphous In-Ga-Zn-Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous Gizo (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of Igzo Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

* cited by examiner

SEMICONDUCTOR DEVICE AND METHOD FOR MANUFACTURING THE SAME

BACKGROUND OF THE INVENTION

1. Field of the Invention

The technical field of the disclosed invention relates to a semiconductor device and a method for manufacturing the semiconductor device.

2. Description of the Related Art

There are a wide variety of metal oxides and such material oxides are used for various applications. An indium oxide is a well-known material and is used as a transparent electrode material which is necessary for liquid crystal displays and the like.

Some metal oxides have semiconductor characteristics. The examples of such metal oxides having semiconductor characteristics are a tungsten oxide, a tin oxide, an indium oxide, a zinc oxide, and the like. A thin film transistor in which a channel formation region is formed using such metal oxides having semiconductor characteristics is known (for example, see Patent Documents 1 to 4 and Non-Patent Document 1 and the like).

As metal oxides, multi-component oxides as well as single-component oxides are known. For example, homologous compound, $InGaO_3(ZnO)_m$ (m is natural number) is known as a multi-component oxide containing In, Ga and Zn (for example, see Non-Patent Documents 2 to 4 and the like).

Furthermore, it is confirmed that an oxide semiconductor including such an In—Ga—Zn-based oxide is applicable to a channel layer of a thin film transistor (for example, see Patent Document 5, Non-Patent Documents 5 and 6, and the like).

REFERENCES

[Patent Document 1] Japanese Published Patent Application No. S60-198861
[Patent Document 2] Japanese Published Patent Application No. H8-264794
[Patent Document 3] Japanese Translation of PCT International Application No. H11-505377
[Patent Document 4] Japanese Published Patent Application No. 2000-150900
[Patent Document 5] Japanese Published Patent Application No. 2004-103957
[Non-Patent Document]
[Non-Patent Document 1] M. W. Prins, K. O. Grosse-Holz, G Muller, J. F. M. Cillessen, J. B. Giesbers, R. P. Weening, and R. M. Wolf, "A ferroelectric transparent thin-film transistor", *Appl. Phys. Lett.,* 17 Jun. 1996, Vol. 68, pp. 3650-3652
[Non-Patent Document 2] M. Nakamura, N. Kimizuka, and T. Mohri, "The Phase Relations in the $In_2O_3$—$Ga_2ZnO_4$—ZnO System at 1350° C.", *J. Solid State Chem.,* 1991, Vol. 93, pp. 298-315
[Non-Patent Document 3] N. Kimizuka, M. Isobe, and M. Nakamura, "Syntheses and
Single-Crystal Data of Homologous Compounds, $In_2O_3(ZnO)_m$, (m=3, 4, and 5), $InGaO_3(ZnO)_3$, and $Ga_2O_3(ZnO)_m$, (m=7, 8, 9, and 16) in the $In_2O_3$—$ZnGa_2O_4$—ZnO System", *J. Solid State Chem.,* 1995, Vol. 116, pp. 170-178
[Non-Patent Document 4]
M. Nakamura, N. Kimizuka, T. Mohri, and M. Isobe, "Syntheses and crystal structures of new homologous compound, indium iron zinc oxides ($InFeO_3(ZnO)_m$ (m: natural number) and related compounds", *KOTAI BUTSURI (SOLID STATE PHYSICS)*, 1993, Vol. 28, No. 5, pp. 317-327
[Non-Patent Document 5] K. Nomura, H. Ohta, K. Ueda, T. Kamiya, M. Hirano, and H. Hosono, "Thin-film transistor fabricated in single-crystalline transparent oxide semiconductor", *SCIENCE,* 2003, Vol. 300, pp. 1269-1272
[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", *NATURE,* 2004, Vol. 432, pp. 488-492

SUMMARY OF THE INVENTION

As a thin film transistor formed using an In—Ga—Zn-based oxide as described above, an n-channel transistor using electrons as carriers is generally used. On the other hand, from the viewpoint of reduction of power consumption, high-speed operation of an integrated circuit, and the like, a CMOS circuit is needed as a basic structure of a logical circuit. That is, it is necessary to form a p-channel transistor, which uses holes as carriers, over the same substrate as an n-channel transistor.

The conduction mechanism of a so-called oxide semiconductor is different from that of silicon which has been used so far. Therefore, it is difficult to form an n-channel transistor and a p-channel transistor using the same material. Thus, in the case of forming an n-channel transistor and a p-channel transistor over the same substrate, various problems may arise which have not been assumable so far.

In view of the foregoing problems, it is an object of an embodiment of the invention disclosed in this specification and the like (including at least the specification, the scope of the claims, and the drawings) to provide an n-channel transistor and a p-channel transistor each having a preferred structure using an oxide semiconductor. Further, it is another object to provide a preferred method for manufacturing an n-channel transistor and a p-channel transistor each using an oxide semiconductor.

According to an embodiment of the invention disclosed in this specification and the like, an n-channel transistor and a p-channel transistor have different structures. Accordingly, an n-channel transistor and a p-channel transistor can be preferably manufactured over the same substrate, which leads to improvement in productivity. Alternatively, a source electrode or drain electrode of an n-channel transistor is formed using a different material from a source electrode or drain electrode of a p-channel transistor. Accordingly, an n-channel transistor and a p-channel transistor having favorable characteristics can be provided.

For example, a structure of a semiconductor device which is an embodiment of the invention disclosed in this specification and the like includes a first gate electrode and a second gate electrode over a substrate; a gate insulating layer covering the first gate electrode and the second gate electrode; a first oxide semiconductor layer which is provided over the gate insulating layer and which overlaps with the first gate electrode; a second oxide semiconductor layer which is provided over the gate insulating layer and which overlaps with the second gate electrode; a first source electrode or drain electrode which is electrically connected to the first oxide semiconductor layer and is formed using a stacked-layer structure including a first conductive layer containing a first material and a second conductive layer containing a second material; and a second source electrode or drain electrode which is electrically connected to the second oxide semiconductor layer and is formed using a stacked-layer structure including a third conductive layer containing the first material and a fourth conductive layer containing the second material. In the structure, the first oxide semiconductor layer is in contact with the first conductive layer of the first source electrode or drain electrode, and part of the first source electrode or drain electrode is over the first oxide semiconductor layer, and the second oxide semiconductor layer is in contact with the third conductive layer and the fourth conductive layer of the second source electrode or drain electrode, and part of the second oxide semiconductor layer is over the second source electrode or drain electrode.

A structure of a semiconductor device which is another embodiment of the invention disclosed in this specification and the like includes a first gate electrode and a second gate electrode over a substrate; a gate insulating layer covering the first gate electrode and the second gate electrode; a first oxide semiconductor layer which is provided over the gate insulating layer and which overlaps with the first gate electrode; a second oxide semiconductor layer which is provided over the gate insulating layer and which overlaps with the second gate electrode; a first source electrode or drain electrode which is electrically connected to the first oxide semiconductor layer and is formed using a stacked-layer structure including a first conductive layer containing a first material and a second conductive layer containing a second material; and a second source electrode or drain electrode which is electrically connected to the second oxide semiconductor layer and is formed using a third conductive layer containing the second material. In the structure, the first oxide semiconductor layer is in contact with the first conductive layer of the first source electrode or drain electrode, and part of the first source electrode or drain electrode is over the first oxide semiconductor layer. Further, in the structure, the second oxide semiconductor layer is in contact with the third conductive layer of the second source electrode or drain electrode, and part of the second oxide semiconductor layer is over the second source electrode or drain electrode.

In the above, part of the first oxide semiconductor layer functions as a channel formation region of a p-channel transistor, and wherein part of the second oxide semiconductor layer functions as a channel formation region of an n-channel transistor. Here, the first oxide semiconductor layer is preferably formed using a material including a tin oxide, a zinc oxide, a nickel oxide, a copper aluminum oxide, a strontium copper oxide, or the like, for example In the above, it is preferable that the first material be a material which forms a Schottky barrier of, 0.5 eV or lower between the first material and the first oxide semiconductor layer, and the second material be a material which forms a Schottky barrier of 0.5 eV or lower between the second material and the second oxide semiconductor layer. Further, it is preferable that the first material be a material whose work function be higher than 5.0 eV, and wherein the second material is a material whose work function be lower than 4.8 eV.

Furthermore, the above semiconductor device may include a CMOS circuit. That is, a structure in which the first gate electrode is electrically connected to the second gate electrode and the first source electrode or drain electrode is electrically connected to the second source electrode or drain electrode may be used.

A method for manufacturing a semiconductor device which is another embodiment of the invention disclosed in this specification and the like includes the steps of forming a first gate electrode and a second gate electrode over a substrate; forming a gate insulating layer to cover the first gate electrode and the second gate electrode; forming a first oxide semiconductor layer in a region which overlaps with the first gate electrode, over the gate insulating layer; forming a first conductive layer over an entire surface of the substrate to cover the first oxide semiconductor layer; forming a second conductive layer over the entire surface of the substrate to cover the first conductive layer; forming a first source electrode or drain electrode which is electrically connected to the first oxide semiconductor layer by selectively etching the first conductive layer and the second conductive layer, and forming a second source electrode or drain electrode part of which overlaps with the second gate electrode; and forming a second oxide semiconductor layer which is electrically connected to the second source electrode or drain electrode in a region which overlaps with the second gate electrode, over the gate insulating layer.

A method for manufacturing a semiconductor device which is another embodiment of the invention disclosed in this specification and the like includes the steps of forming a first gate electrode and a second gate electrode over a substrate; forming a gate insulating layer to cover the first gate electrode and the second gate electrode; forming a first oxide semiconductor layer in a region which overlaps with the first gate electrode, over the gate insulating layer; forming a first conductive layer over an entire surface of the substrate to cover the first oxide semiconductor layer; selectively removing the first conductive layer in a region overlapping with the second gate electrode and its periphery; forming a second conductive layer over the entire surface of the substrate to cover the first conductive layer; forming a first source electrode or drain electrode which is formed using a stacked-layer structure including the first conductive layer and the second conductive layer and is electrically connected to the first oxide semiconductor layer by selectively etching the first conductive layer and the second conductive layer, and forming a second source electrode or drain electrode which is formed using the second conductive layer and part of which overlaps with the second gate electrode; and forming a second oxide semiconductor layer which is electrically connected to the second source electrode or drain electrode in a region which overlaps with the second gate electrode, over the gate insulating layer.

In the above, it is preferable to form, as the first oxide semiconductor layer, an oxide semiconductor layer functioning as a channel formation region of a p-channel transistor; and form, as the second oxide semiconductor layer, an oxide semiconductor layer functioning as a channel formation region of an n-channel transistor. Here, the first oxide semiconductor layer is preferably formed using a material including a tin oxide, a zinc oxide, a nickel oxide, a copper aluminum oxide, a strontium copper oxide, or the like, for example.

In the above, it is preferable that a material which forms a Schottky barrier of 0.5 eV or lower between the material and the first oxide semiconductor layer be included in the first conductive layer, and a material which forms a Schottky barrier of 0.5 eV or lower between the material and the second oxide semiconductor layer be included in the second conductive layer. Further, it is preferable that a material whose work function is higher than 5.0 eV be included in the first conductive layer, and a material whose work function is lower than 4.8 eV be included in the second conductive layer.

Furthermore, the above semiconductor device may include a CMOS circuit. That is, the first gate electrode and the second gate electrode may be formed so as to be electrically connected to each other, and the first source electrode or drain electrode and the second source electrode or drain electrode may be formed so as to be electrically connected to each other.

Note that in this specification and the like, a semiconductor device means any device which can function by utilizing semiconductor characteristics; and a display device, a semiconductor circuit, and an electronic device are all included in the semiconductor devices.

According to one embodiment of the disclosed invention, a structure and a material of an electrode are devised, whereby a semiconductor device which takes full advantage of characteristics of an n-channel transistor and a p-channel transistor can be provided. That is, characteristics of a semiconductor device can be improved. Further, with such a structure, increase in the number of masks used can be suppressed and cost for manufacturing a semiconductor device can be reduced. Furthermore, by reduction of the number of steps, productivity can be improved.

As described above, according to one embodiment of the disclosed invention, an n-channel transistor and a p-channel transistor each having a preferred structure using an oxide semiconductor can be provided, and further, a preferred method for manufacturing an n-channel transistor and a p-channel transistor each using an oxide semiconductor can be provided.

DETAILED DESCRIPTION OF THE INVENTION

Figure 1A:
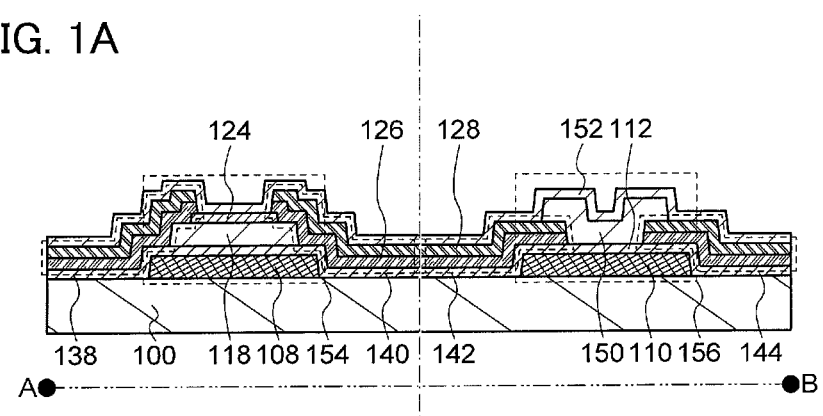
FIGS. 1A and 1B are a cross-sectional view and a plan view which illustrate a semiconductor device.

Hereinafter, Embodiments are described in detail with reference to drawings. Note that the present invention is not limited to the description of Embodiments below, and it is apparent to those skilled in the art that modes and details can be modified in various ways without departing from the spirit of the invention disclosed in this specification and the like. Structures of different Embodiments can be implemented in combination as appropriate. On the description of the structure of the invention below, the same portions or portions having similar functions are denoted by the same reference numerals in the structure, and the description thereof is omitted.

(Embodiment 1)

In this embodiment, an example of a structure of a semiconductor device is described with reference to FIGS. 1A and 1B, and an example of a method for manufacturing a semiconductor device is described with reference to FIGS. 2A to 2D, FIGS. 3A to 3D, and FIGS. 4A to 4D.

<Example of Structure of Semiconductor Device>

Figure 1B:
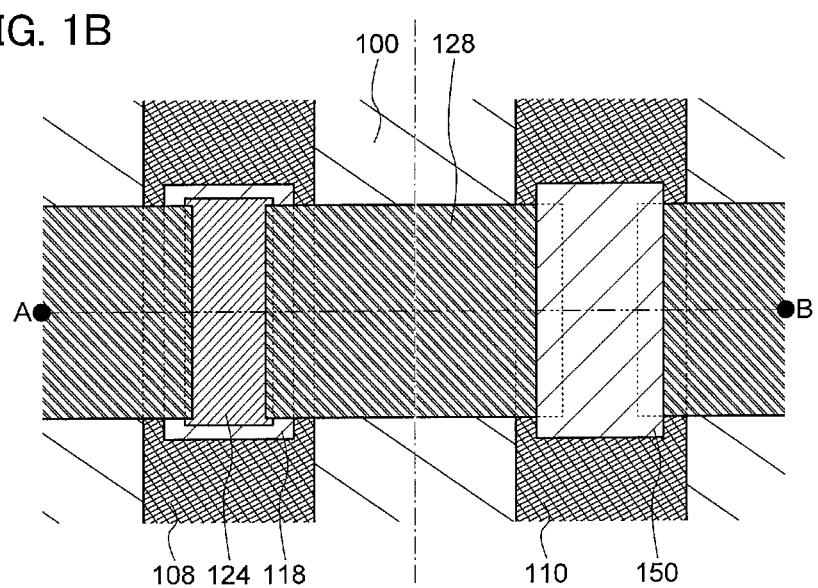

FIGS. 1A and 1B illustrate the example of the structure of the semiconductor device according to Embodiment 1. FIG 1A is a cross-sectional view, and FIG. 1B is a plan view. FIG. 1A illustrates a cross section taken along line A-B in FIG. 1B. Note that in the plan view, part of the structure is omitted for simplicity.

The semiconductor device illustrated in FIGS. 1A and 1B relates to a first transistor 154 and a second transistor 156 each using an oxide semiconductor and includes a substrate 100 (for example, a substrate having an insulating surface); a first gate electrode 108 and a second gate electrode 110 over the substrate 100; a gate insulating layer 112 covering the first gate electrode 108 and the second gate electrode 110; a first oxide semiconductor layer 118 which is provided over the gate insulating layer 112 and which overlaps with the first gate electrode 108; a second oxide semiconductor layer 150 which is provided over the gate insulating layer 112 and which overlaps with the second gate electrode 110; a first source electrode or drain electrode 138 (and a first source electrode or drain electrode 140) which is electrically connected to the first oxide semiconductor layer 118 and is formed using a stacked-layer structure including a first conductive layer 126 and a second conductive layer 128; and a second source electrode or drain electrode 142 (and a second source electrode or drain electrode 144) which is electrically connected to the second oxide semiconductor layer 150 and is formed using a stacked-layer structure including the first conductive layer 126 and the second conductive layer 128 (see FIGS. 1A and 1B).

Note that among the first conductive layer 126 and the second conductive layer 128, only the first conductive layer 126 is in contact with the first oxide semiconductor layer 118, and part of the first source electrode or drain electrode 138 (the first source electrode or drain electrode 140) is over the first oxide semiconductor layer 118. The second oxide semiconductor layer 150 is in contact with both the first conductive layer 126 and the second conductive layer 128, and part of the second oxide semiconductor layer 150 is over the second source electrode or drain electrode 142 (the second source electrode or drain electrode 144).

A protective layer 124 functioning as an etching stopper at the time of etching the first conductive layer 126 and the second conductive layer 128 is formed over the first oxide semiconductor layer 118. Further, an insulating layer 152 is formed to cover the first transistor 154 and the second transistor 156.

Note that since functions of the source electrode and the drain electrode in each of the transistors are sometimes replaced with each other depending on the direction in which carriers flow in the above, "source electrode" and "drain electrode" are used only for convenience. In other words, a function of each electrode should not be construed as being limited to its terms. Further, each electrode may have a function as a wiring.

Here, it is preferable that the first transistor be a p-channel transistor and the second transistor be an n-channel transistor. In this case, part of the first oxide semiconductor layer functions as a channel formation region of the p-channel transistor, and part of the second oxide semiconductor layer functions as a channel formation region of the n-channel transistor. Note that the first oxide semiconductor layer is preferably formed using a material including a tin oxide, a zinc oxide, a nickel oxide, a copper aluminum oxide, a strontium copper oxide, or the like, for example.

Note that in the transistor 154 and the transistor 156, the first source electrode or drain electrode 138 (the first source electrode or drain electrode 140) and the second source electrode or drain electrode 142 (the second source electrode or drain electrode 144) each have a stacked-layer structure of different materials. Further, the connection between the first oxide semiconductor layer 118 and the first source electrode or drain electrode 138 (the first source electrode or drain electrode 140) is different from the connection between the second oxide semiconductor layer 150 and the second source electrode or drain electrode 142 (the second source electrode or drain electrode 144). More specifically, although the second oxide semiconductor layer 150 is in contact with both the first conductive layer 126 and the second conductive layer 128, the first oxide semiconductor layer 118 is in contact with only the first conductive layer 126, among the first conductive layer 126 and the second conductive layer 128.

Accordingly, the best use of characteristics of a p-channel transistor, which are more degraded due to an electrode than those of an n-channel transistor, can be fully allowed. In order to achieve the effect sufficiently, it is preferable to use materials whose work functions satisfy given conditions to be used as the first material for the first conductive layer 126 and the second material for the second conductive layer 128. For example, in the first transistor 154 which is a p-channel transistor, a material used for the first conductive layer 126 in contact with the first oxide semiconductor layer 118 (that is, the first material) can be determined by the relation with a valence band of the first oxide semiconductor layer 118. Specifically, a material which forms a Schottky bather of 0.5 eV or lower between the first conductive layer and a valence band of the first oxide semiconductor layer 118 is preferably used as the first material for the first conductive layer 126. Further, for example, in the second transistor 156 which is an n-channel transistor, a material for the second conductive layer 128 mainly in contact with the second oxide semiconductor layer 150 (that is, the second material) can be determined by the relation with a conduction band of the second oxide semiconductor layer 150. Specifically, a material which forms a Schottky barrier of 0.5 eV or lower between the second conductive layer and a conduction band of the second oxide semiconductor layer 150 is preferably used as the second material for the second conductive layer 128. More specifically, for example, a material whose work function is higher than 5.0 eV (preferably, higher than 5.2 eV) is preferably used as the first material for the first conductive layer 126, and a material whose work function is lower than 4.8 eV (preferably, lower than 4.5 eV) is preferably used as the second material for the second conductive layer 128.

By the formation of the first conductive layer 126 and the second conductive layer 128 using such materials, a hole injecting property in a p-channel transistor can be sufficiently secured. Accordingly, even in the case where an n-channel transistor and a p-channel transistor are formed over the same substrate (including the case where an n-channel transistor and a p-channel transistor are formed through the same step), the p-channel transistor can be prevented from degrading its characteristics. That is, characteristics of a semiconductor device can be improved.

In the case where the above-described structure is used, it is not necessary to form different electrodes in each transistor. Thus, increase in the number of masks used can be suppressed, which leads to reduction of cost of manufacturing semiconductor devices. Furthermore, by reduction of the number of steps, productivity can be improved.

A CMOS circuit can be formed using the transistors. In this case, it is preferable to use, in part of a CMOS circuit, a structure where the first gate electrode 108 and the second gate electrode 110 are electrically connected to each other and the first source electrode or drain electrode 138 (or the first source electrode or drain electrode 140) and the second source electrode or drain electrode 142 (or the second source electrode or drain electrode 144) are electrically connected to each other.

<Example of Method for Manufacturing Semiconductor Device>

Next, an example of a method for manufacturing the above-described semiconductor device is described with reference to FIGS. 2A to 2D, FIGS. 3A to 3D, and FIGS. 4A to 4D.

Figure 2A:
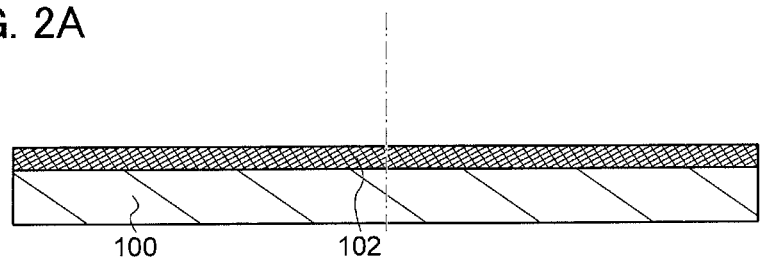
FIGS. 2A to 2D are cross-sectional views which illustrate a method for manufacturing a semiconductor device.

First, a conductive layer 102 is formed over the substrate 100 (for example, a substrate having an insulating surface) (see FIG. 2A).

Any substrate can be used for the substrate 100 as long as it is a substrate having an insulating surface, for example, a glass substrate. The glass substrate is preferably a non-alkali glass substrate. As a material of the non-alkali glass substrate, a glass material such as aluminosilicate glass, aluminoborosilicate glass, barium borosilicate glass, or the like is used, for example. Alternatively, as the substrate 100, an insulator substrate formed using an insulator such as a ceramic substrate, a quartz substrate, or a sapphire substrate; a semiconductor substrate which is formed using a semiconductor material such as silicon and whose surface is covered with an insulating material; or a conductor substrate which is formed using a conductor such as metal or stainless steel and whose surface is covered with an insulating material can be used. A plastic substrate or the like can also be used as long as it can withstand thermal treatment in a manufacturing step.

The conductive layer 102 is preferably formed using a conductive material such as aluminum (Al), copper (Cu), molybdenum (Mo), tungsten (W), or titanium (Ti). As a formation method, a sputtering method, a vaccum evaporation method, and the like are given. In the case of using aluminum (or copper) for the conductive layer 102, since aluminum itself (or copper itself) has disadvantages such as low heat resistance and a tendency to be corroded, it is preferable to use aluminum (or copper) in combination with a conductive material having heat resistance.

As the conductive material having heat resistance, it is possible to use metal containing an element selected from titanium (Ti), tantalum (Ta), tungsten (W), molybdenum (Mo), chromium (Cr), neodymium (Nd), and scandium (Sc), an alloy containing any of these elements as its component, an alloy containing a combination of any of these elements, a nitride containing any of these elements as its component, or the like. The conductive material having heat resistance and aluminum (or copper) may be stacked, whereby the conductive layer 102 may be formed.

Although not shown, the substrate 100 may be provided with a base layer. The base layer has a function of preventing diffusion of an impurity from the substrate 100. In other words, the base layer can realize improvement in the reliability of the semiconductor device. The base layer may be formed to have a single-layer structure or a stacked-layer structure using a variety of insulating materials such as a silicon nitride or a silicon oxide. Specifically, for example, a structure in which a silicon nitride and a silicon oxide are stacked in that order over the substrate 100 is favorable. A silicon nitride has features of an extremely high blocking effect against an impurity.

Figure 2B:
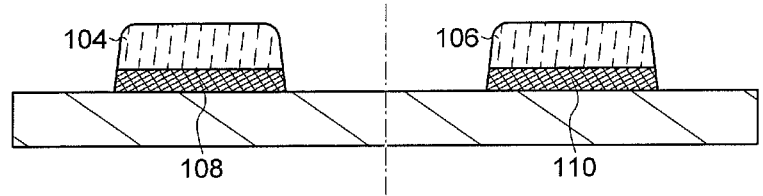

Next, a resist mask 104 and a resist mask 106 are selectively formed over the conductive layer 102, and, with the use of the resist masks, the conductive layer 102 is selectively etched, whereby the gate electrode 108 and the gate electrode 110 are formed (see FIG. 2B).

The resist mask 104 and the resist mask 106 are formed through steps such as application of a resist material, light exposure using a photomask, and development. For the application of the resist material, a method such as a spin-coating method can be employed. Note that the resist mask 104 and the resist mask 106 may be selectively formed by a droplet discharging method, a screen printing method, or the like. In this case, the step of light disposure using a photomask is not needed; therefore, improvement in productivity can be achieved. The resist mask 104 and the resist mask 106 are removed after the gate electrode 108 and the gate electrode 110 are formed by etching the conductive layer 102.

As the above etching, dry etching may be used, or wet etching may be used. In order to improve coverage of a gate insulating layer or the like which is formed later and prevent disconnection of the gate insulating layer at the gate electrode, the etching is preferably performed so that the gate electrode 108 and the gate electrode 110 are tapered. In this case, for example, the gate electrode 108 and the gate electrode 110 are preferably tapered at a taper angle 20° or more and less than 90°. Here, the "taper angle" refers to an angle formed by a side surface of a layer which is tapered to a bottom surface thereof.

Figure 2C:
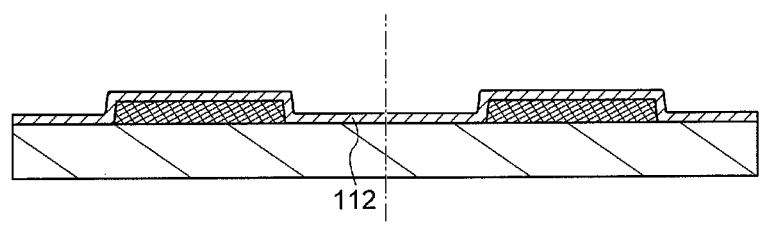

Next, the gate insulating layer 112 is formed to cover the gate electrode 108 and the gate electrode 110 (see FIG. 2C). The gate insulating layer 112 can be formed using a material such as a silicon oxide, a silicon oxynitride, a silicon nitride, a silicon nitride oxide, an aluminum oxide, or a tantalum oxide. Further, films made of any of these materials may be stacked to form the gate insulating layer 112. These films are preferably formed to a thickness of greater than or equal to 5 nm and less than or equal to 250 nm by a variety of film formation methods such as a sputtering method. For example, as the gate insulating layer 112, a silicon oxide film can be formed to a thickness of 100 nm by a sputtering method. Needless to say, the gate insulating layer 112 may be formed by other methods such as a CVD method.

Alternatively, the gate insulating layer 112 with a stacked-layer structure may be formed by combination of a sputtering method and a CVD method (a plasma CVD method or the like). For example, a lower layer of the gate insulating layer 112 (a portion in contact with the gate electrode 108 and the gate electrode 110) can be formed by a plasma CVD method and an upper layer of the gate insulating layer 112 can be formed by a sputtering method. Since a film with favorable step coverage is easily formed by a plasma CVD method, it is suitable for a method for forming a film just above the gate electrode 108 and the gate electrode 110. In the case of using a sputtering method, since it is easy to reduce hydrogen concentration in the film as compared with the case of using a plasma CVD method, by providing a film by a sputtering method in a region in contact with a semiconductor layer, hydrogen in the gate insulating layer 112 can be prevented from being diffused into the semiconductor layer. Specifically, in the case where a semiconductor layer is formed using an oxide semiconductor material, since it is considered that hydrogen has a great influence on characteristics, it is effective to employ such a structure.

Note that in this specification and the like, an oxynitride refers to a substance that contains more oxygen (atoms) than nitrogen (atoms). For example, a silicon oxynitride is a substance including oxygen, nitrogen, silicon, and hydrogen in ranges of 50 at. % to 70 at. %, 0.5 at. % to 15 at. %, 25 at. % to 35 at. %, and 0.1 at. % to 10 at. %, respectively. Further, a silicon nitride oxide refers to the one in which the content (the number of atoms) of nitrogen is larger than the content of oxygen and includes, for example, oxygen, nitrogen, silicon, and hydrogen at concentrations of greater than or equal to 5 at. % and, less than or equal to 30 at. %, greater than or equal to 20 at. % and less than or equal to 55 at. %, greater than or equal to 25 at. % and less than or equal to 35 at. %, and greater than or equal to 10 at. % and less than or equal to 25 at. %, respectively. Note that rates of oxygen, nitrogen, silicon, and hydrogen fall within the aforementioned ranges in the cases where measurement is performed using Rutherford backscattering spectrometry (RBS) or hydrogen forward scattering (HFS). Moreover, the total for the content ratio of the constituent elements does not exceed 100 at. %.

Figure 2D:
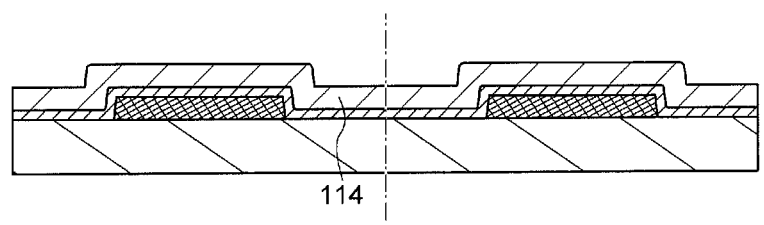

Next, an oxide semiconductor layer 114 is formed to cover the gate insulating layer 112 (see FIG. 2D). In Embodiment 1, as the oxide semiconductor layer 114, an oxide semiconductor layer which can be formed as a channel formation region of the p-channel transistor is formed. Specifically, the oxide semiconductor layer 114 is formed to include any of a tin oxide, a zinc oxide, a nickel oxide, a copper aluminum oxide, or a strontium copper oxide, for example. Examples of a formation method include a method such as a sputtering method using a target including any of the above materials. As the above sputtering method, an RF sputtering method using a high frequency power supply for a power supply for sputtering, a DC sputtering method using a DC power supply, a pulsed DC sputtering method in which a DC bias is applied in a pulse manner, or the like can be employed. Note that a material and a formation method of the oxide semiconductor layer 114 are not limited to the above material and the formation method as long as a p-channel transistor can be realized. In addition, the oxide semiconductor layer 114 may have a thickness of approximately 5 nm to 200 nm.

In Embodiment 1, the case of forming the oxide semiconductor layer 114 using a single layer is described; however, the oxide semiconductor layer 114 may be formed using a stacked-layer structure. For example, an oxide semiconductor layer with high conductivity may be formed only in a region of the first oxide semiconductor layer 118 in contact with the first source electrode or drain electrode 138 (the first source electrode or drain electrode 140) to be formed later. The oxide semiconductor layer with high conductivity can be realized with the use of constituent elements with different ratios. With such a structure, the source electrode or drain electrode and the oxide semiconductor layer are electrically connected to each other in a favorable manner, whereby element characteristics can be improved.

Figure 3A:
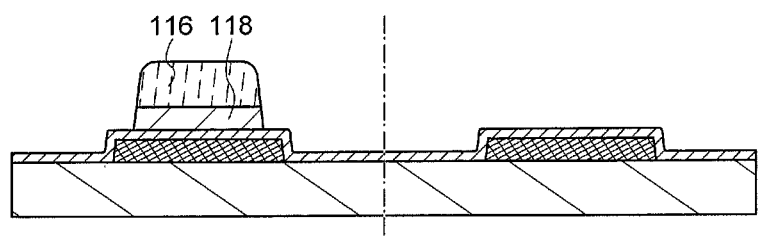
FIGS. 3A to 3D are cross-sectional views which illustrate a method for manufacturing a semiconductor device.

Next, a resist mask 116 is selectively formed over the semiconductor layer 114 and the semiconductor layer 114 is selectively etched using the resist mask 116, whereby the island-like first oxide semiconductor layer 118 is formed (see FIG. 3A). Here, the resist mask 116 can be formed in a manner similar to the resist mask 104 and the resist mask 106. Note that the resist mask 116 is removed after the first oxide semiconductor layer 118 is formed by etching the oxide semiconductor layer 114.

Wet etching or dry etching can be used for etching of the oxide semiconductor layer 114. An etchant (an etching solution) used for the wet etching and an etching gas used for the dry etching are not limited in particular as long as the oxide semiconductor layer 114 can be etched. For example, in the case of using wet etching, a mixed solution of acetic acid, nitric acid, and phosphoric acid can be used. In the case of performing dry etching, a gas containing chlorine or a gas containing chlorine to which oxygen is added is preferably used.

Note that, for the dry etching, an etching apparatus using a reactive ion etching method (an RIE method), or a dry etching apparatus using a high-density plasma source such as ECR (electron cyclotron resonance) or ICP (inductively coupled plasma) can be used. Moreover, an etching apparatus with an ECCP (enhanced capacitively coupled plasma) mode may be used, by which electric discharge is likely to be homogeneous in a larger area as compared to the case of an ICP etching apparatus. The ECCP mode etching apparatus can be applied even when a substrate of the tenth generation or later is used.

Figure 3B:
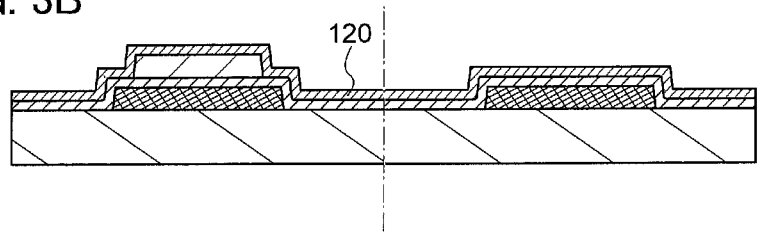

Next, an insulating layer 120 is formed to cover the first oxide semiconductor layer 118 (see FIG. 3B). Since the insulating layer 120 is an insulating layer to be an etching-stop layer later, the insulating layer is preferably formed using a material having etching selectivity to a conductive layer which is formed later. The insulating layer 120 can be formed using a material such as a silicon oxide, a silicon oxynitride, a silicon nitride, a silicon nitride oxide, an aluminum oxide, or a tantalum oxide. Further, the insulating layer 120 can be formed by a variety of film formation methods such as a sputtering method or a CVD method. In the case where the etching-stop layer is not provided, the insulating layer 120 is not necessarily formed.

Figure 3C:
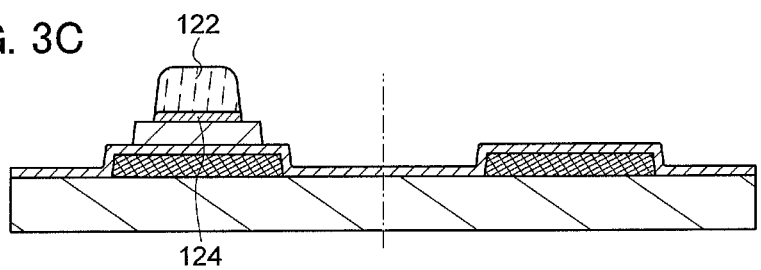

Next, a resist mask 122 is selectively formed over the insulating layer 120 and the insulating layer 120 is selectively etched using the resist mask 122, whereby the protective layer 124 is formed (see FIG. 3C). Here, the resist mask 122 can be formed in a manner similar to the resist mask 104 and the like. The resist mask 122 is removed after the protective layer 124 is formed by etching the insulating layer 120.

Figure 3D:
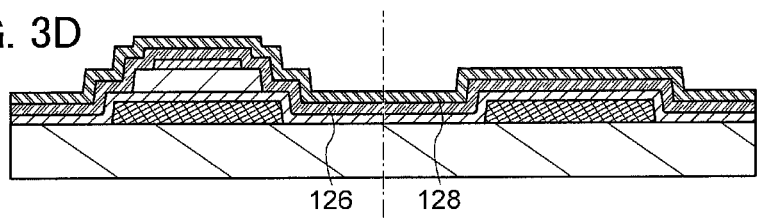

Next, the first conductive layer 126 and the second conductive layer 128 are formed to cover the first oxide semiconductor layer 118, the protective layer 124, and the gate insulating layer 112 (see FIG. 3D). Here, the first conductive layer and the second conductive layer are preferably formed using different materials. Specifically, the first conductive layer 126 is formed using a material which is suitable for a source electrode or drain electrode of a p-channel transistor, and the second conductive layer 128 is formed using a material which is suitable for a source electrode or drain electrode of an n-channel transistor. Thus, characteristics of a transistor to be formed can be fully ensured.

For example, a material whose work function is higher than 5.0 eV (preferably, higher than 5.2 eV) is preferably used as the first material for the first conductive layer 126, and a material whose work function is lower than 4.8 eV (preferably, lower than 4.5 eV) is preferably used as the second material for the second conductive layer 128. It can be said that a material which forms a Schottky barrier of 0.5 eV or lower between the first conductive layer and a valence band of the first oxide semiconductor layer is used as the first material, and a material which forms a Schottky barrier of 0.5 eV or lower between the second conductive layer and a conduction band of the second oxide semiconductor layer is used as the second material. The selection of such materials can suppress the reduction of a property of injecting holes to the first oxide semiconductor layer due to a Schottky barrier between the first oxide semiconductor layer 118 and the first conductive layer 126. Similarly, the selection of such materials can suppress the reduction of a property of injecting electrons to the second oxide semiconductor layer 150 included in an n-channel transistor formed later.

Examples of the first material which is used for the first conductive layer 126 include gold, platinum, nickel, copper, cobalt, and an indium tin oxide. Examples of the second material which is used for the second conductive layer 128 include titanium, aluminum, molybdenum, and tungsten. Each of the first conductive layer 126 and the second conductive layer 128 formed using any of these materials may be formed by a film formation method such as a sputtering method or a vaccum evaporation method.

The details of energy of a valence band of a p-type oxide semiconductor material are not apparent. However, it is confirmed that when an electrode material whose work function is higher than 5.0 eV (preferably, higher than 5.2 eV) is used in the case of a tin oxide, favorable transistor characteristics can be obtained. The same can be said for other p-type oxide semiconductor materials. On the other hand, the energy of a conduction band of an n-type oxide semiconductor material is approximately 4.3 eV in the case of an In—Ga—Zn-based oxide, for example. Further, it is confirmed that, in the case of using an electrode material whose work function is lower than 4.8 eV (preferably, lower than 4.5 eV), favorable transistor characteristics can be obtained. Note that it is known that the energy of a conduction band of an n-type oxide semiconductor material is approximately 3 eV to 5 eV.

Figure 4A:
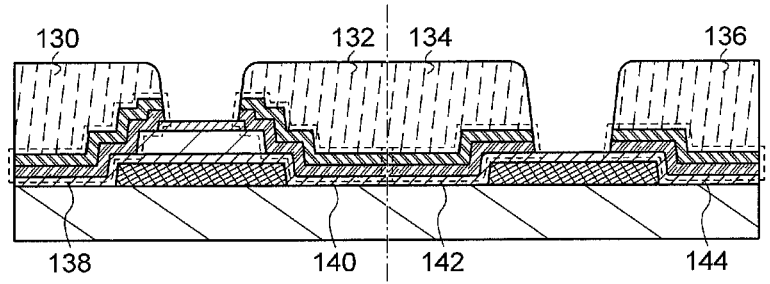
FIGS. 4A to 4D are cross-sectional views which illustrate a method for manufacturing a semiconductor device.

Next, a resist mask 130, a resist mask 132, a resist mask 134, and a resist mask 136 are selectively formed over the second conductive layer 128, and the first conductive layer 126 and the second conductive layer 128 are selectively etched using the resist masks, whereby the first source electrode or drain electrode 138 and the first source electrode or drain electrode 140 which are connected to the first oxide semiconductor layer, and the second source electrode or drain electrode 142 and the second source electrode or drain electrode 144 which are connected to an oxide semiconductor layer of an n-channel transistor later are formed (see FIG. 4A). The resist masks can be formed in a manner similar to the resist mask 104 and the like. The resist masks are removed after the first conductive layer 126 and the second conductive layer 128 are etched.

Figure 4B:
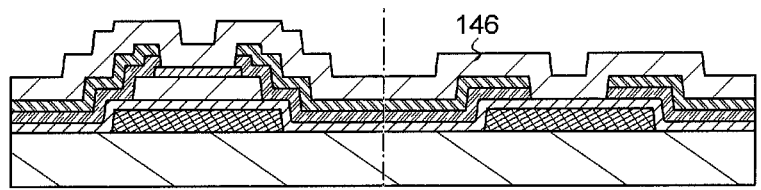

Next, an oxide semiconductor layer 146 is formed to cover the second source electrode or drain electrode 142 and the second source electrode or drain electrode 144 each of which is formed using a stacked-layer structure including the first conductive layer 126 and the second conductive layer 128 (see FIG. 4B). In Embodiment 1, as the oxide semiconductor layer 146, an oxide semiconductor layer which can be used for a channel formation region of an n-channel transistor is formed. Specifically, for example, the oxide semiconductor layer 146 may be formed using a substance represented by $InMO_3(ZnO)_m$ (m>0), where M denotes one or more of metal elements selected from gallium (Ga), iron (Fe), nickel (Ni), manganese (Mn), cobalt (Co), and the like. For example, the case where Ga is selected as M includes the case where the aforementioned metal element other than Ga, such as a combination of Ga and Ni or a combination of Ga and Fe, is selected as well as the case where only Ga is used. Moreover, in the above oxide semiconductor, in some cases, a transition metal element such as Fe or Ni or an oxide of the transition metal is contained as an impurity element in addition to a metal element contained as M. Needless to say, the oxide semiconductor material is not limited to the above materials and a variety of oxide semiconductor materials such as a zinc oxide or an indium oxide can be used. The oxide semiconductor layer 146 is formed in a manner similar to the oxide semiconductor layer 114; therefore, for the details of the oxide semiconductor layer 146, the formation method of the oxide semiconductor layer 114 may be referred to.

In Embodiment 1, the case of forming the oxide semiconductor layer 146 using a single layer is described; however, the oxide semiconductor layer 146 may be formed using a stacked-layer structure. For example, an oxide semiconductor layer with high conductivity may be formed only in a region in contact with the second source electrode or drain electrode 142 (the second source electrode or drain electrode 144) to be formed later. The oxide semiconductor layer with high conductivity can be realized with the use of constituent elements with different ratios. With such a structure, the source electrode or drain electrode and the oxide semiconductor layer are electrically connected to each other in a favorable manner, whereby element characteristics can be improved.

Figure 4C:
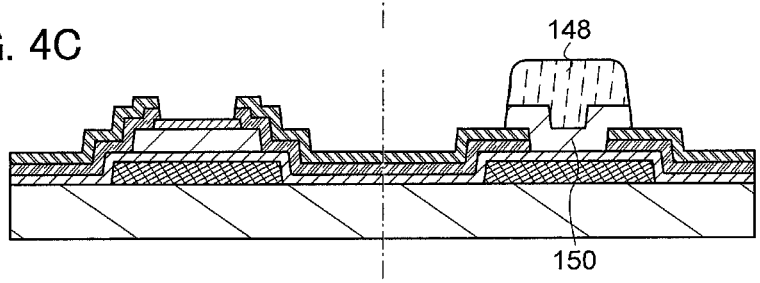

Next, a resist mask 148 is selectively formed over the oxide semiconductor layer 146, and the oxide semiconductor layer 146 is selectively etched using the resist mask 148, whereby the island-like second oxide semiconductor layer 150 is formed (see FIG. 4C). Here, the resist mask 148 can be formed in a manner similar to the resist mask 104 and the like. Note that the resist mask 148 is removed after the second oxide semiconductor layer 150 is formed by etching the oxide semiconductor layer 146. For the details of the etching, the details of the etching of the oxide semiconductor layer 114 may be referred to.

Figure 4D:
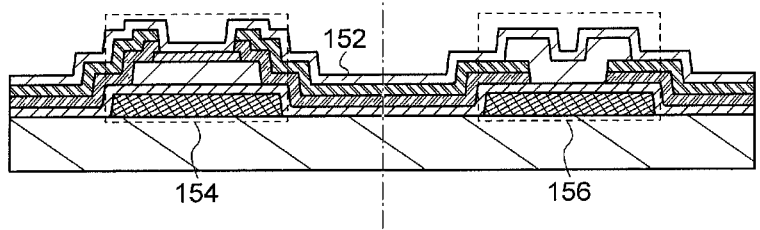

Next, the insulating layer 152 is formed to cover the first source electrode or drain electrode 138, the first source electrode or drain electrode 140, the second source electrode or drain electrode 142, the second source electrode or drain electrode 144, the first oxide semiconductor layer 118, the second oxide semiconductor layer 150, and the like (see FIG. 4D). Accordingly, a semiconductor device including the first transistor 154 and the second transistor 156 is completed. Here, the insulating layer 152 corresponds to a so-called interlayer insulating layer. The insulating layer 152 can be formed using a material such as a silicon oxide, an aluminum oxide, or a tantalum oxide. The insulating layer 152 may also be formed using a stack including films made of any of these materials.

In the structure disclosed in Embodiment 1, the source electrode or drain electrode is formed using a stacked-layer structure including the first conductive layer 126 and the second conductive layer 128. Therefore, the p-channel transistor and the n-channel transistor have different structures. That is, the second source electrode or drain electrode 142 and the second source electrode or drain electrode 144 are formed in contact with a lower portion (or a side surface) of the second oxide semiconductor layer 150 in the n-channel transistor, whereas the first source electrode or drain electrode 138 and the first source electrode or drain electrode 140 are formed in contact with an upper portion (or a side surface) of the first oxide semiconductor layer 118 in the p-channel transistor.

Here, in the case where the first conductive layer 126 is formed using the second material and the second conductive layer 128 is formed using the first material, the structure of the p-channel transistor and the structure of the n-channel transistor can be replaced with each other (in that case, the first oxide semiconductor layer 118 is formed using the second material to form an n-channel transistor and the second oxide semiconductor layer 150 is formed using the first material to form a p-channel transistor). However, in that case, both the first conductive layer 126 and the second conductive layer 128 are in contact with the oxide semiconductor layer of the p-channel transistor, whereby characteristics of a p-channel transistor by which characteristics of a semiconductor device is greatly affected may be impaired. Therefore, it is preferable to use the above-described structure.

Note that thermal treatment is preferably performed at 100° C. to 500° C., typically 200° C. to 400° C., after the first oxide semiconductor layer 118 and the second oxide semiconductor layer 150 are formed. By the thermal treatment, the characteristics of a semiconductor element can be improved, and variation in characteristics can be reduced. The atmosphere in which the thermal treatment is performed can be, for example, an air atmosphere, a nitrogen atmosphere, an oxygen atmosphere, an atmosphere containing water vapor, or the like. Further, the thermal treatment time can be about 0.1 hour to 5 hours. The timing of the thermal treatment is not limited in particular as long as the thermal treatment is performed after the oxide semiconductor layer 114 to be the first oxide semiconductor layer 118 is formed or after the oxide semiconductor layer 146 to be the second oxide semiconductor layer 150 is formed.

Further, all the resist masks used in Embodiment 1 can be formed using a multi-tone mask. Here, the multi-tone mask is a mask which enables light exposure with multi-level light intensity. With the use of the multi-tone mask, one-time exposure and development process allow a resist mask with plural thicknesses (typically, two kinds of thicknesses) to be formed. That is, with the use of the multi-tone mask, the number of steps can be suppressed.

With the structure and the material of the electrode which are described in Embodiment 1, the best use of characteristics of an n-channel transistor and a p-channel transistor can be fully allowed. Accordingly, characteristics of a semiconductor device can be further improved. Further, with such a structure, increase in the number of masks used can be suppressed, and thus, cost of manufacturing a semiconductor device can be reduced. Furthermore, by reduction of the number of steps, productivity can be improved.

As described above, an embodiment of the disclosed invention is very useful in providing an n-channel transistor and a p-channel transistor each having a preferable structure using an oxide semiconductor or in providing a preferable method for manufacturing an n-channel transistor and a p-channel transistor each using an oxide semiconductor.

(Embodiment 2)

In Embodiment 2, another example of a structure of a semiconductor device is described with reference to FIGS. 5A and 5B, and another example of a method for manufacturing a semiconductor device is described with reference to FIGS. 6A to 6E. Note that the structure of a semiconductor device to be described in Embodiment 2 has a lot in common with the structure of the semiconductor device described in Embodiment 1. Therefore, portions different from those in Embodiment 1 are mainly described below.

<Example of Structure of Semiconductor Device>

Figure 5A:
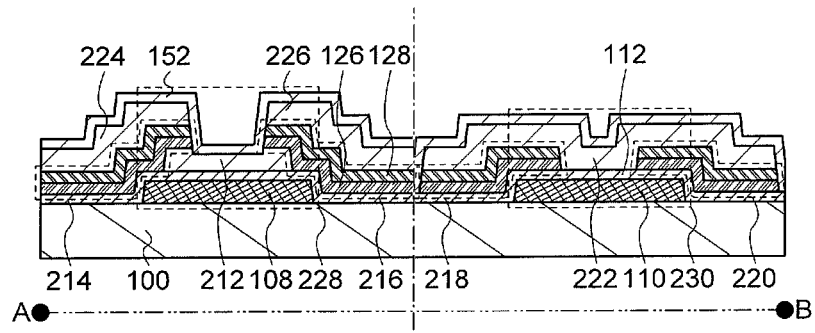
FIGS. 5A and 5B are a cross-sectional view and a plan view which illustrate a semiconductor device.
Figure 5B:
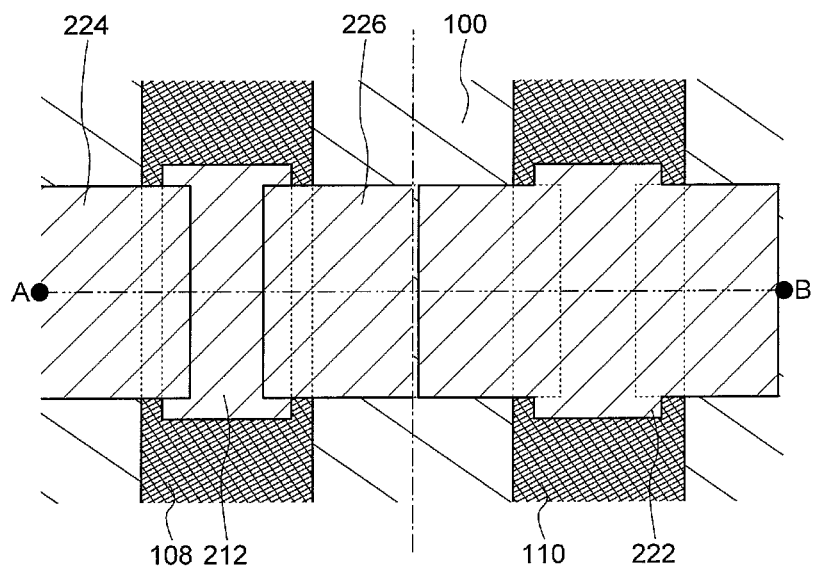

FIGS. 5A and 5B illustrate an example of a structure of a semiconductor device according to Embodiment 2. FIG. 5A is a cross-sectional view, and FIG. 5B is a plan view. FIG. 5A illustrates a cross section taken along line A-B in FIG. 5B. Note that in the plan view, part of the structure is omitted for simplicity.

A semiconductor device illustrated in FIGS. 5A and 5B relates to a first transistor 228 and a second transistor 230 using an oxide semiconductor and includes the substrate 100 (for example, a substrate having an insulating surface); the first gate electrode 108 and the second gate electrode 110 over the substrate 100; the gate insulating layer 112 covering the first gate electrode 108 and the second gate electrode 110; the first oxide semiconductor layer 212 which is provided over the gate insulating layer 112 and which overlaps with the first gate electrode 108; the second oxide semiconductor layer 222 which is provided over the gate insulating layer 112 and which overlaps with the second gate electrode 110; the first source electrode or drain electrode 214 (and a first source electrode or drain electrode 216) which is formed using a stacked-layer structure including the first conductive layer 126 and the second conductive layer 128 and is electrically connected to the first oxide semiconductor layer 212; and a second source electrode or drain electrode 218 (and a second source electrode or drain electrode 220) which is formed using a stacked-layer structure including the first conductive layer 126 and the second conductive layer 128 and is electrically connected to the second oxide semiconductor layer 222 (see FIGS. 5A and 5B).

One different point of the semiconductor device in Embodiment 2 from the semiconductor device described in Embodiment 1 is the existence of the protective layer 124 functioning as an etching stopper. That is, the semiconductor device described in Embodiment 1 is not provided with the protective layer 124. Therefore, part of the first oxide semiconductor layer 118 is removed by etching, so that the first oxide semiconductor layer 212 is formed. Further, due to a step of forming the second oxide semiconductor layer 222, the first source electrode or drain electrode 214 (the first source electrode or drain electrode 216) and the second source electrode or drain electrode 218 (the second source electrode or drain electrode 220), the oxide semiconductor layer 224 and the oxide semiconductor layer 226 are provided over the first source electrode or drain electrode 214 (the first source electrode or drain electrode 216), and the shape of the second oxide semiconductor layer is much different from that in Embodiment 1.

As described in Embodiment 2, in the case where the protective layer 124 functioning as an etching stopper is not formed, cost of manufacturing a semiconductor device can be further reduced. Furthermore, the number of steps is reduced, and productivity can be improved.

<Example of Method for Manufacturing Semiconductor Device>

Next, an example of a method for manufacturing the semiconductor device will be described with reference to FIGS. 6A to 6E. Note that steps up to forming the first oxide semiconductor layer 118 are similar to those in Embodiment 1; therefore, for the details thereof, Embodiment 1 may be referred to (see FIGS. 2A to 2D and FIG. 3A).

Figure 6A:
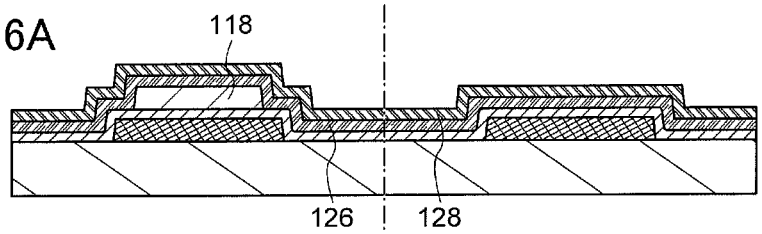
FIGS. 6A to 6E are cross-sectional views which illustrate a method for manufacturing a semiconductor device.

After the first oxide semiconductor layer 118 is formed, the first conductive layer 126 and the second conductive layer 128 are formed to cover the first oxide semiconductor layer 118 and the gate insulating layer 112 (see FIG. 6A). For the details of the first conductive layer 126 and the second conductive layer 128, Embodiment 1 can be referred to.

Figure 6B:
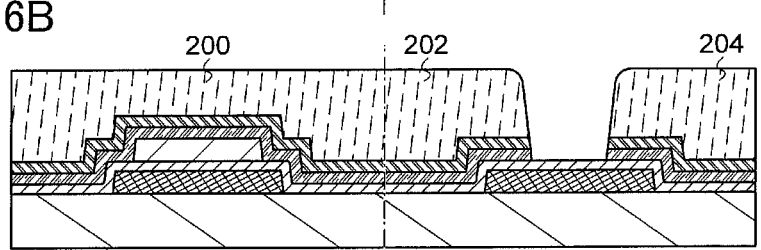

Next, a resist mask 200, a resist mask 202, and a resist mask 204 are selectively formed over the second conductive layer 128, and the first conductive layer 126 and the second conductive layer 128 are selectively etched using the resist masks (see FIG. 6B). Thus, part of the gate insulating layer 112 overlapping with the gate electrode 110 is exposed. For the details of the resist masks and the etching, Embodiment 1 may be referred to.

Figure 6C:
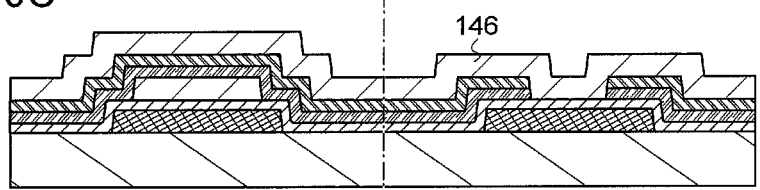
Figure 6D:
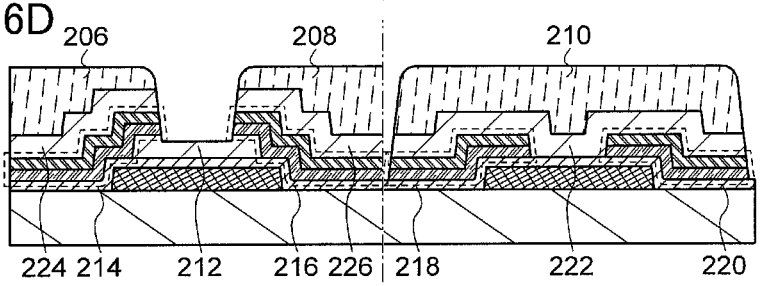

Next, the oxide semiconductor layer 146 is formed to cover the gate insulating layer 112 and a stacked-layer structure including the first conductive layer 126 and the second conductive layer 128 (see FIG. 6C). For also the details of the oxide semiconductor layer 146, Embodiment 1 may be referred to.

Next, a resist mask 206 a resist mask 208, and a resist mask 210 are selectively formed over the oxide semiconductor layer 146, and the first conductive layer 126, the second conductive layer 128, and the oxide semiconductor layer 146 are selectively etched using the resist masks. Thus, the first oxide semiconductor layer 212, which is the first oxide semiconductor layer 118 partly etched, the first source electrode or drain electrode 214 and the first source electrode or drain electrode 216 which are connected to the first oxide semiconductor layer 212, the second source electrode or drain electrode 218 and the second source electrode or drain electrode 220, and the second oxide semiconductor layer 222 which is connected to the second source electrode or drain electrode 218 and the second source electrode or drain electrode 220 are formed (see FIG. 6D). For the details of the resist masks and the etching, Embodiment 1 can be referred to.

Although the oxide semiconductor layer 224 and the oxide semiconductor layer 226 remain over the first source electrode or drain electrode 214 and the first source electrode or drain electrode 216, respectively, by etching the oxide semiconductor layer 146, there is no large variation in transistor characteristics due to this.

Figure 6E:
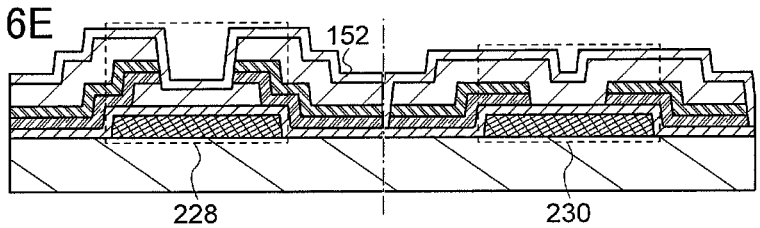

Then, the insulating layer 152 is formed to cover the first source electrode or drain electrode 214, the first source electrode or drain electrode 216, the second source electrode or drain electrode 218, the second source electrode or drain electrode 220, the first oxide semiconductor layer 212, the second oxide semiconductor layer 222, and the like (see FIG. 6E). Thus, a semiconductor device including the first transistor 228 and the second transistor 230 is completed. Here, the insulating layer 152 corresponds to a so-called interlayer insulating layer. For the details thereof, Embodiment 1 may be referred to.

With the structure and the material of the electrode which are described in Embodiment 2, the best use of characteristics of an n-channel transistor and a p-channel transistor can be fully allowed. Accordingly, characteristics of a semiconductor device can be further improved. Further, with such a structure, increase in the number of masks used can be suppressed, and thus, cost of manufacturing a semiconductor device can be reduced. Furthermore, by reduction of the number of steps, productivity can be improved.

Moreover, in Embodiment 2, a protective layer functioning as an etching stopper is not formed. Therefore, cost of manufacturing semiconductor devices can be further reduced. Further, by reduction of the number of steps, productivity can be improved.

Note that Embodiment 2 can be implemented in combination with Embodiment 1 as appropriate.

(Embodiment 3)

In Embodiment 3, another example of a structure of a semiconductor device is described with reference to FIGS. 7A and 7B, and another example of a method for manufacturing a semiconductor device is described with reference to FIGS. 8A to 8D and FIGS. 9A to 9C. Note that the structure of a semiconductor device to be described in Embodiment 3 has a lot in common with the structures of the semiconductor devices described in Embodiments 1 and 2. Therefore, portions different from Embodiments 1 and 2 are mainly described below.

<Example of Structure of Semiconductor Device>

Figure 7A:
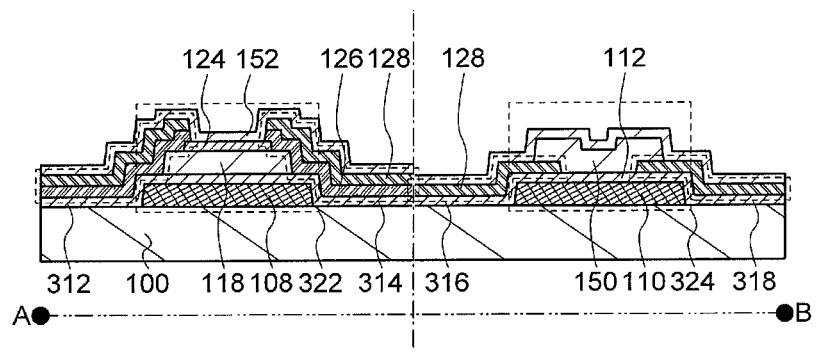
FIGS. 7A and 7B are a cross-sectional view and a plan view which illustrate a semiconductor device.
Figure 7B:
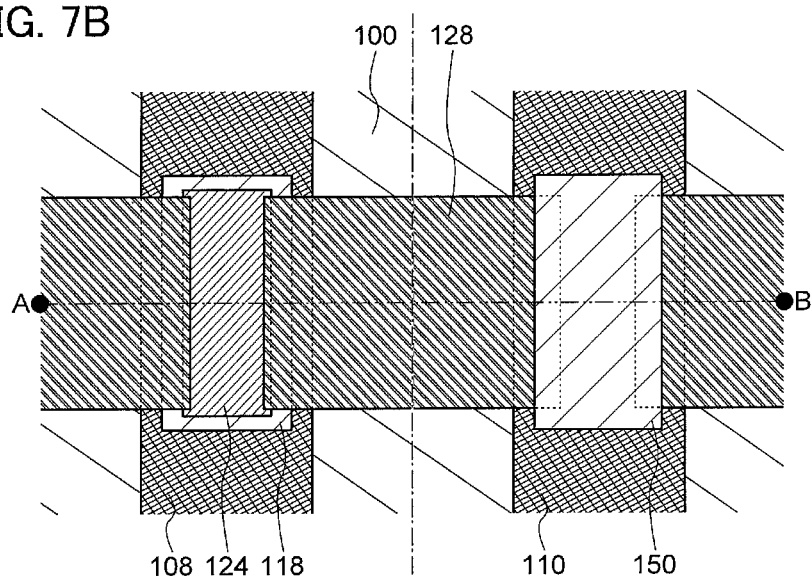

FIGS. 7A and 7B illustrate an example of a structure of a semiconductor device according to Embodiment 3. FIG. 7A is a cross-sectional view, and FIG. 7B is a plan view. Note that FIG. 7A illustrates a cross section taken along line A-B in FIG. 7B. Note that in the plan view, part of the structure is omitted for simplicity.

The semiconductor device illustrated in FIGS. 7A and 7B relates to a first transistor 322 and a second transistor 324 each using an oxide semiconductor and includes the substrate 100 (for example, a substrate having an insulating surface); the first gate electrode 108 and the second gate electrode 110 over the substrate 100; the gate insulating layer 112 covering the first gate electrode 108 and the second gate electrode 110; the first oxide semiconductor layer 118 which is provided over the gate insulating layer 112, and which overlaps with the first gate electrode 108; the second oxide semiconductor layer 150 which is provided over the gate insulating layer 112 and which overlaps with the second gate electrode 110; a first source electrode or drain electrode 312 (a first source electrode or drain electrode 314) which is electrically connected to the first oxide semiconductor layer 150 and is formed using a stacked-layer structure including the first conductive layer 126 and the second conductive layer 128; and a second source electrode or drain electrode 316 (a second source electrode or drain electrode 318) which is electrically connected to the second oxide semiconductor layer 150 and is formed using the second conductive layer 128 (see FIGS. 7A and 7B).

One different point of the semiconductor device in Embodiment 3 from the semiconductor devices described in Embodiments 1 and 2 is the structure of the second source electrode or drain electrode. That is, in the semiconductor device described in Embodiment 3, the second source electrode or drain electrode is formed using only the second conductive layer 128. Therefore, the first conductive layer 126 is not in contact with the second oxide semiconductor layer 150.

As described in Embodiment 3, by the formation of the second source electrode or drain electrode using only the second conductive layer 128, only a conductive layer formed using a material suitable for an electrode of an n-channel transistor (that is, the second material) can be made in contact with the second oxide semiconductor layer 150. Thus, transistor characteristics can be improved as compared to the case where the first conductive layer 126 is in contact with the second oxide semiconductor layer 150.

<Example of Method for Manufacturing Semiconductor Device>

Next, an example of a method for manufacturing a semiconductor device is described with reference to FIGS. 8A to 8D and FIGS. 9A to 9C. Note that steps up to forming the protective layer 124 are similar to those in Embodiment 1; therefore, for the details thereof, Embodiment 1 may be referred to (see FIGS. 2A to 2D and FIGS. 3A to 3C).

Figure 8A:
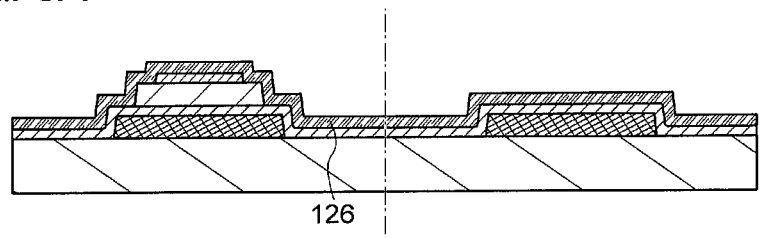
FIGS. 8A to 8D are cross-sectional views which illustrate a method for manufacturing a semiconductor device.

After the protective layer 124 is formed, the first conductive layer 126 is formed to cover the protective layer 124, the first oxide semiconductor layer 118, and the gate insulating layer 112 (see FIG. 8A). For the details of the first conductive layer 126, Embodiment 1 can be referred to.

Figure 8B:
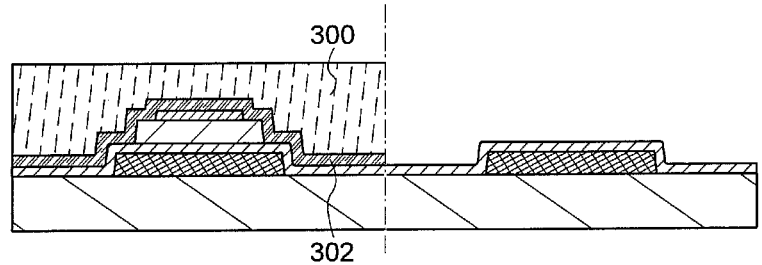

Next, a resist mask 300 is selectively formed over the first conductive layer 126, and the first conductive layer 126 is selectively etched using the resist mask 300 to form a first conductive layer 302 (see FIG. 8B). Thus, a region of the first conductive layer 126 overlapping with the gate electrode 110 and its periphery are removed. For the details of the resist mask and the etching, Embodiment 1 may be referred to.

Figure 8C:
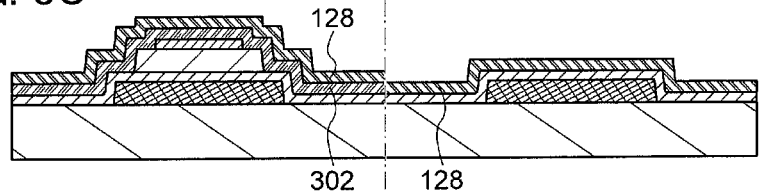

Next, the second conductive layer 128 is formed to cover the first conductive layer 302 and the gate insulating layer 112 (see FIG. 8C). Thus, in the region overlapping with the gate electrode 110 and its periphery, the second conductive layer 128 is formed over the gate insulating layer 112. For the details of the second conductive layer 128, Embodiment 1 can be referred to.

Figure 8D:
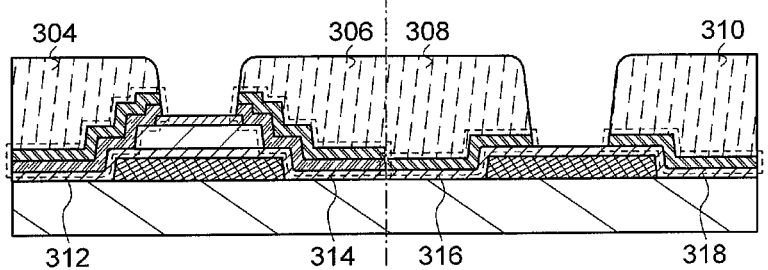

A resist mask 304, a resist mask 306, a resist mask 308, and a resist mask 310 are selectively formed over the second conductive layer 128, and the first conductive layer 302 and the second conductive layer 128 are selectively etched using the resist masks, whereby the first source electrode or drain electrode 312, the first source electrode or drain electrode 314, the second source electrode or drain electrode 316, and the second source electrode or drain electrode 318 are formed (see FIG. 8D). For the details of the resist masks and the etching, Embodiment 1 may be referred to.

Figure 9A:
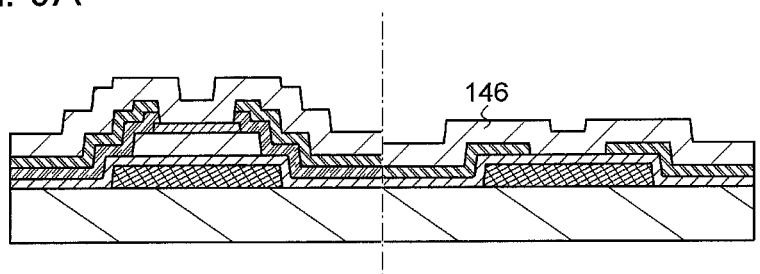
FIGS. 9A to 9C are cross-sectional views which illustrate a method of manufacturing a semiconductor device.

Next, the oxide semiconductor layer 146 is formed to cover the second source electrode or drain electrode 316 and the second source electrode or drain electrode 318 which are formed using the second conductive layer 128 (see FIG. 9A). For the details of the oxide semiconductor layer 146, Embodiment 1 can be referred to.

Figure 9B:
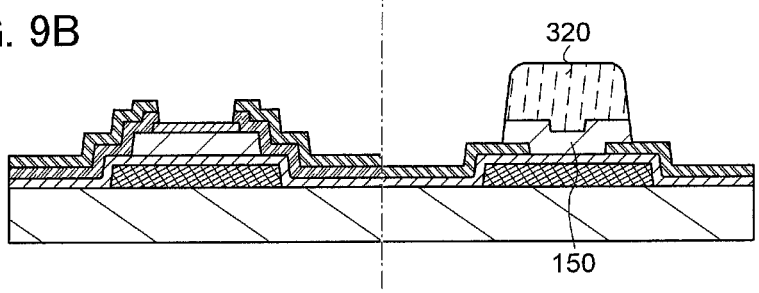

Next, a resist mask 320 is selectively formed over the oxide semiconductor layer 146, and the oxide semiconductor layer 146 is selectively etched using the resist mask, whereby the second oxide semiconductor layer 150 is formed (see FIG. 9B). For the details of the resist mask and the etching, Embodiment 1 can be referred to.

Figure 9C:
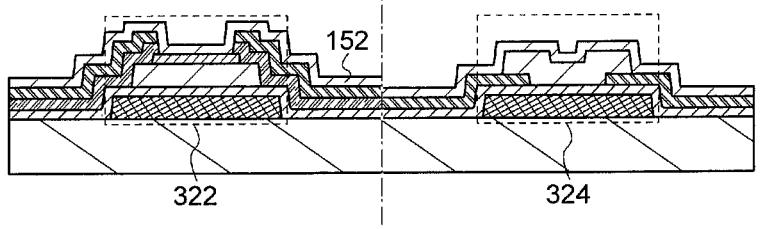

Then, the insulating layer 152 is formed to cover the first source electrode or drain electrode 312, the first source electrode or drain electrode 314, the second source electrode or drain electrode 316, the second source electrode or drain electrode 318, the first oxide semiconductor layer 118, the second oxide semiconductor layer 150, and the like (see FIG. 9C). Thus, a semiconductor device including the first transistor 322 and second transistor 324 is completed. Here, the insulating layer 152 corresponds to a so-called interlayer insulating layer. For the details thereof, Embodiment 1 may be referred to.

With the structure and the material of the electrode which are described in Embodiment 3, the best use of characteristics of an n-channel transistor and a p-channel transistor can be fully allowed. Accordingly, characteristics of a semiconductor device can be further improved. Further, with such a structure, increase in the number of masks used can be suppressed, and thus, cost of manufacturing a semiconductor device can be reduced. Furthermore, by reduction of the number of steps, productivity can be improved.

Further, by the formation of the second source electrode or drain electrode using only the second conductive layer, only a conductive layer formed using a material suitable for an electrode of an n-channel transistor (that is, the second material) can be in contact with the second oxide semiconductor layer. Thus, transistor characteristics can be improved as compared to the case where the first conductive layer is in contact with the second oxide semiconductor layer.

Note that Embodiment 3 can be implemented in combination with Embodiments 1 and 2 as appropriate.

(Embodiment 4)

Circuit characteristics of the case where a CMOS circuit is formed using the transistor described in any of Embodiments 1 to 3 above were confirmed by computer simulation. In Embodiment 4, the results will be described.

The computer simulation was performed with a device simulator "ATLAS" developed by Silvaco Data Systems Inc. Note that, in Embodiment 4, in order to examine characteristics of a CMOS circuit, computer simulation was performed on a ring oscillator using a CMOS circuit. Odd numbers of CMOS inverter circuits are connected in series, whereby a ring oscillator is formed. That is, the number of n-channel transistors and the number of p-channel transistors in a ring oscillator are the same. Further, the oscillation frequency of a ring oscillator can be used as an indication of device performance.

Figure 10:
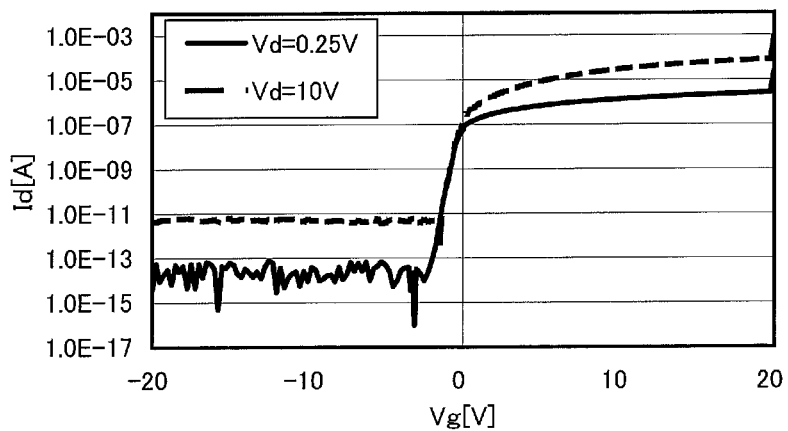
FIG. 10 is a graph showing a gate voltage (Vg)-drain current (Id) curve of an n-channel transistor.
Figure 11:
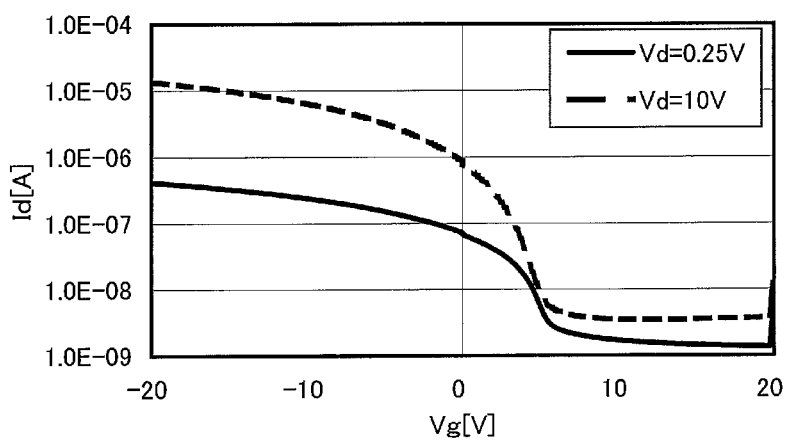
FIG. 11 is a graph showing a gate voltage (Vg)-drain current (Id) curve of a p-channel transistor.

FIG. 10 shows a gate voltage (Vg)-drain current (Id) curve of an n-channel transistor using an oxide semiconductor. FIG. 11 shows a gate voltage (Vg)-drain current (Id) curve of a p-channel transistor using an oxide semiconductor. In FIGS. 10 and 11, the horizontal axis indicates a gate voltage (Vg) and the vertical axis indicates a drain current (Id). The solid line indicates a curve in the case where a drain voltage is 0.25

(V), and the dashed line indicates a curve in the case where a drain voltage is 10 (V). Here, the channel length (L) of the n-channel transistor was set to 10 μm and the channel width (W) thereof was set to 10 μm. Further, the channel length (L) of the p-channel transistor was set to 10 μm and the channel width (W) thereof was set to 20 μm. Furthermore, the thickness of a gate insulating layer was set to 100 nm, and the dielectric constant thereof was set to 4.1. The thickness of a semiconductor layer was set to 50 nm.

With respect to the semiconductor layer of the n-channel transistor, the conditions were set as follows: a band gap of 3.05 eV; an electron affinity of 4.3 eV; a work function of 4.3 eV; an electron mobility of 15 cm$^2$/V·s; and a hole mobility of 0.1 cm$^2$/V·s. With respect to the semiconductor layer of the p-channel transistor, the conditions were set as follows: a band gap of 3.0 eV; an electron affinity of 2.8 eV; a work function of 5.5 eV; an electron mobility of 0.1 cm$^2$/V·s; and a hole mobility of 1.0 cm$^2$/V·s. Under the above-described conditions, the computation was performed.

Further, in computing off current, leakage current due to a tunnel between bands was assumed. Note that the p-channel transistor had an approximately double-digit on/off ratio.

Figure 12:
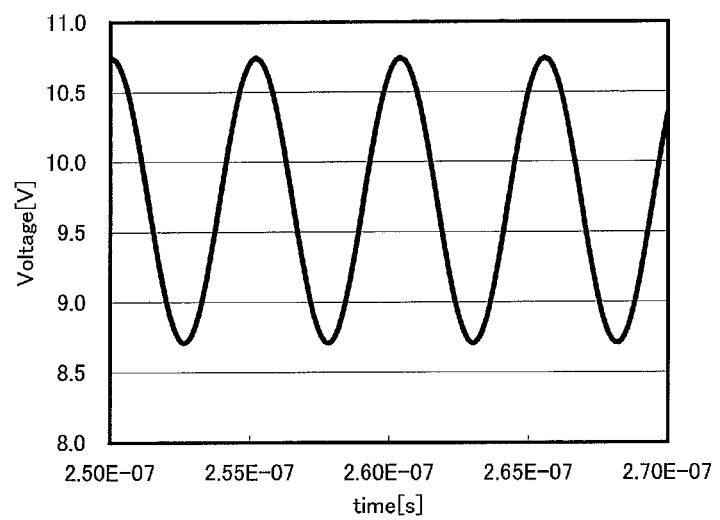
FIG. 12 shows the state of oscillation of a ring oscillator.

The state of oscillation of the ring oscillator having three-stage CMOS inverter circuits which are connected in series and are formed using the n-channel transistor and the p-channel transistor was confirmed. FIG. 12 shows the result. The horizontal axis indicates time (s) and the vertical axis indicates voltage (V). Here, a power supply voltage was set to 15 (V). FIG. 12 shows that one period is approximately 5 ns and the oscillation frequency is approximately 200 MHz.

As described above, the operation of a CMOS circuit formed using an oxide semiconductor transistor, which is an embodiment of the disclosed invention, is confirmed. The p-channel transistor used in Embodiment 4 has an approximately double-digit on/off ratio. Though it is hard to say that such on/off ratio represents an adequate characteristic, there is not a big problem in the operation of a CMOS circuit. The improvement and the development of a p-channel oxide semiconductor material enable further improvement in characteristics of a CMOS circuit.

Note that the structure of the transistor which is an embodiment of the disclosed invention is very effective in realizing such a CMOS circuit.

This application is based on Japanese Patent Application serial no. 2009-095739 filed with Japan Patent Office on Apr. 10, 2009, the entire contents of which are hereby incorporated by reference.

What is claimed is:

1. A semiconductor device comprising:
   a first gate electrode and a second gate electrode over a substrate;
   a gate insulating layer covering the first gate electrode and the second gate electrode;
   a first oxide semiconductor layer provided over the gate insulating layer and overlapping with the first gate electrode;
   a first source electrode or drain electrode provided over, and electrically connected to the first oxide semiconductor layer, wherein the first source electrode or drain electrode comprises a first conductive layer containing a first material and a second conductive layer containing a second material over the first conductive layer;
   a second source electrode or drain electrode provided over the gate insulating layer, wherein the second source electrode or drain electrode comprises a third conductive layer containing the first material and a fourth conductive layer containing the second material over the third conductive layer, and
   a second oxide semiconductor layer provided over and electrically connected to the second source electrode or drain electrode, and overlapping with the second gate electrode.

2. A semiconductor device comprising:
   a first gate electrode and a second gate electrode over a substrate;
   a gate insulating layer covering the first gate electrode and the second gate electrode;
   a first oxide semiconductor layer provided over the gate insulating layer and overlapping with the first gate electrode;
   a first source electrode or drain electrode provided over, and electrically connected to the first oxide semiconductor layer, wherein the first source electrode or drain electrode comprises a first conductive layer containing a first material and a second conductive layer containing a second material over the first conductive layer;
   a second source electrode or drain electrode provided over the gate insulating layer, wherein the second source electrode or drain electrode comprises a third conductive layer containing the second material, and a second oxide semiconductor layer provided over and electrically connected to the second source electrode or drain electrode, and overlapping with the second gate electrode.

3. The semiconductor device according to claim 1, wherein part of the first oxide semiconductor layer functions as a channel formation region of a p-channel transistor, and wherein part of the second oxide semiconductor layer functions as a channel formation region of an n-channel transistor.

4. The semiconductor device according to claim 2, wherein part of the first oxide semiconductor layer functions as a channel formation region of a p-channel transistor, and wherein part of the second oxide semiconductor layer functions as a channel formation region of an n-channel transistor.

5. The semiconductor device according to claim 1,
   wherein a Schottky barrier of 0.5 eV or lower is formed between the first material and the first oxide semiconductor layer, and
   wherein a Schottky barrier of 0.5 eV or lower is formed between the second material and the second oxide semiconductor layer.

6. The semiconductor device according to claim 2,
   wherein a Schottky barrier of 0.5 eV or lower is formed between the first material and the first oxide semiconductor layer, and
   wherein a Schottky barrier of 0.5 eV or lower is formed between the second material and the second oxide semiconductor layer.

7. The semiconductor device according to claim 1,
   wherein the first material is a material whose work function is higher than 5.0 eV, and
   wherein the second material is a material whose work function is lower than 4.8 eV.

8. The semiconductor device according to claim 2,
   wherein the first material is a material whose work function is higher than 5.0 eV, and
   wherein the second material is a material whose work function is lower than 4.8 eV.

9. The semiconductor device according to claim 1,
   wherein the first gate electrode is electrically connected to the second gate electrode, and wherein the first source electrode or drain electrode is electrically connected to the second source electrode or drain electrode.

10. The semiconductor device according to claim 2, wherein the first gate electrode is electrically connected to the second gate electrode, and
wherein the first source electrode or drain electrode is electrically connected to the second source electrode or drain electrode.

11. The semiconductor device according to claim 1, wherein the first oxide semiconductor layer is in contact with the first conductive layer, and the second oxide semiconductor layer is in contact with the third conductive layer and the fourth conductive layer.

12. The semiconductor device according to claim 2, wherein the first oxide semiconductor layer is in contact with the first conductive layer, and the second oxide semiconductor layer is in contact with the third conductive layer.

13. The semiconductor device according to claim 1, wherein the first oxide semiconductor layer comprises a material selected from the group consisting of a tin oxide, a zinc oxide, a nickel oxide, a copper aluminum oxide, and a strontium copper oxide.

14. The semiconductor device according to claim 2, wherein the first oxide semiconductor layer comprises a material selected from the group consisting of a tin oxide, a zinc oxide, a nickel oxide, a copper aluminum oxide, and a strontium copper oxide.

15. The semiconductor device according to claim 1, wherein the second oxide semiconductor layer comprises a substance represented by $InMO_3(ZnO)_m$, where m is larger than 0, and M denotes one or more of metal elements selected from gallium, iron, nickel, manganese, cobalt.

16. The semiconductor device according to claim 2, wherein the second oxide semiconductor layer comprises a substance represented by $InMO_3(ZnO)_m$, where m is larger than 0, and M denotes one or more of metal elements selected from gallium, iron, nickel, manganese, cobalt.

17. The semiconductor device according to claim 1, wherein the first material is a material selected from the group consisting of gold, platinum, nickel, copper, cobalt, and an indium tin oxide.

18. The semiconductor device according to claim 2, wherein the first material is a material selected from the group consisting of gold, platinum, nickel, copper, cobalt, and an indium tin oxide.

19. The semiconductor device according to claim 1, wherein the second material is a material selected from the group consisting of titanium, aluminum, molybdenum, and tungsten.

20. The semiconductor device according to claim 2, wherein the second material is a material selected from the group consisting of titanium, aluminum, molybdenum, and tungsten.

21. A method for manufacturing a semiconductor device, comprising the steps of:
forming a first gate electrode and a second gate electrode over a substrate;
forming a gate insulating layer to cover the first gate electrode and the second gate electrode;
forming a first oxide semiconductor layer in a region which overlaps with the first gate electrode, over the gate insulating layer;
forming a first conductive layer over an entire surface of the substrate to cover the first oxide semiconductor layer;
forming a second conductive layer over the entire surface of the substrate to cover the first conductive layer;
forming a first source electrode or drain electrode and a second source electrode or drain electrode by selectively etching the first conductive layer and the second conductive layer so that the first source electrode or drain electrode is electrically connected to the first oxide semiconductor layer, and a part of the second source electrode or drain electrode overlaps with the second gate electrode; and
forming a second oxide semiconductor layer which is electrically connected to the second source electrode or drain electrode in a region which overlaps with the second gate electrode, over the gate insulating layer and the second source electrode or drain electrode.

22. A method for manufacturing a semiconductor device, comprising the steps of:
forming a first gate electrode and a second gate electrode over a substrate;
forming a gate insulating layer to cover the first gate electrode and the second gate electrode;
forming a first oxide semiconductor layer in a region which overlaps with the first gate electrode, over the gate insulating layer;
forming a first conductive layer over an entire surface of the substrate to cover the first oxide semiconductor layer;
selectively removing the first conductive layer in a region overlapping with the second gate electrode and its periphery;
forming a second conductive layer over the entire surface of the substrate to cover the first conductive layer after selectively removing the first conductive layer;
forming a first source electrode or drain electrode and a second source electrode or drain electrode by selectively etching the first conductive layer and the second conductive layer so that the first source electrode or drain electrode comprises the first conductive layer and the second conductive layer and is electrically connected to the first oxide semiconductor layer, and the second source electrode or drain electrode comprises the second conductive layer and part of which overlaps with the second gate electrode; and
forming a second oxide semiconductor layer which is electrically connected to the second source electrode or drain electrode in a region which overlaps with the second gate electrode, over the gate insulating layer and the second source electrode or drain electrode.

23. The method for manufacturing a semiconductor device according to claim 21, further comprising the steps of forming, as the first oxide semiconductor layer, an oxide semiconductor layer functioning as a channel formation region of a p-channel transistor; and forming, as the second oxide semiconductor layer, an oxide semiconductor layer functioning as a channel formation region of an n-channel transistor.

24. The method for manufacturing a semiconductor device according to claim 22, further comprising the steps of forming, as the first oxide semiconductor layer, an oxide semiconductor layer functioning as a channel formation region of a p-channel transistor;
and forming, as the second oxide semiconductor layer, an oxide semiconductor layer functioning as a channel formation region of an n-channel transistor.

25. The method for manufacturing a semiconductor device according to claim 21,
wherein a Schottky barrier of 0.5 eV or lower is formed between the first conductive layer and the first oxide semiconductor layer, and wherein a Schottky barrier of 0.5 eV or lower is formed between the second conductive layer and the second oxide semiconductor layer.

26. The method for manufacturing a semiconductor device according to claim 22,
wherein a Schottky barrier of 0.5 eV or lower is formed between the first conductive layer and the first oxide semiconductor layer, and
wherein a Schottky barrier of 0.5 eV or lower is formed between the second conductive layer and the second oxide semiconductor layer.

27. The method for manufacturing a semiconductor device according to claim 21,
wherein the first conductive layer comprises a first material whose work function is higher than 5.0 eV, and
wherein the second conductive layer comprises is a second material whose work function is lower than 4.8 eV.

28. The method for manufacturing a semiconductor device according to claim 22,
wherein the first conductive layer comprises a first material whose work function is higher than 5.0 eV, and
wherein the second conductive layer comprises is a second material whose work function is lower than 4.8 eV.

29. The method for manufacturing a semiconductor device according to claim 21,
wherein the first gate electrode and the second gate electrode are formed so as to be electrically connected to each other, and
wherein the first source electrode or drain electrode and the second source electrode or drain electrode are formed so as to be electrically connected to each other.

30. The method for manufacturing a semiconductor device according to claim 22,
wherein the first gate electrode and the second gate electrode are formed so as to be electrically connected to each other, and
wherein the first source electrode or drain electrode and the second source electrode or drain electrode are formed so as to be electrically connected to each other.

\* \* \* \* \*